United States Patent [19]

Ohno et al.

[11] Patent Number: 5,296,710
[45] Date of Patent: Mar. 22, 1994

[54] INFRARED RADIATION DETECTOR

[75] Inventors: Katsuhiro Ohno, Hyogo; Akifumi Wada; Yousuke Sugiura, both of Kanagawa; Masatoshi Yasunaga, Hyogo, all of Japan

[73] Assignee: Mitsubishi Denki Kabushiki Kaisha, Tokyo, Japan

[21] Appl. No.: 868,836

[22] Filed: Apr. 15, 1992

[30] Foreign Application Priority Data

Jun. 11, 1991 [JP] Japan .................................. 3-168926

[51] Int. Cl.$^5$ .............................................. G01J 5/04
[52] U.S. Cl. .................................. 250/352; 250/370.15
[58] Field of Search ........................... 250/352, 370.15

[56] References Cited

U.S. PATENT DOCUMENTS

| | | | |
|---|---|---|---|
| 4,451,735 | 5/1984 | Diedrich et al. | 250/352 |
| 4,912,548 | 3/1990 | Shanker et al. | 257/715 |
| 4,995,236 | 2/1991 | Rouquier et al. | 62/51.1 |

FOREIGN PATENT DOCUMENTS

| | | |
|---|---|---|
| 0364347 | 4/1990 | European Pat. Off. |
| 58-33859 | 2/1983 | Japan. |
| 2-214158 | 8/1990 | Japan. |

*Primary Examiner*—Constantine Hannaher
*Attorney, Agent, or Firm*—Wolf, Greenfield & Sacks

[57] ABSTRACT

An infrared radiation detector so adapted as to prevent the image signals from deteriorating due to the short length of leads extending within the cryogenic container with the infrared radiation sensing element accommodated within and to correspond to the increasing number of the leads and terminals, associated with a high density of elements. The infrared radiation detector is composed of an inner cylinder and an outer cylinder. The outer cylinder is disposed so as to lie in the same plane as the sub-package on which the multi-layered ceramic lead plate composed of a plurality of bonding pads for wire bonding, internally embedded lead layers, and plug-in terminals for fetching signals is mounted. The bonding pad of the sub-package is bonded to the bonding pad of the ceramic lead plate through a wire bonding.

14 Claims, 3 Drawing Sheets

INFRARED RADIATION DETECTOR

BACKGROUND OF THE INVENTION

1. Field of the Invention

The present invention relates to an infrared radiation image detector for detecting infrared radiation radiated from a material as image data and, more particularly, to improvements in the structure of a cryogenic container with a sensing element disposed thereto.

2. Description of the Prior Art

A sensing element for sensing infrared radiation, which takes advantage of Schottkey joints of semi-conductor silicon, is so low in a joint barrier that operations at room temperature are difficult and that the operations should be conducted at cryogenic temperatures, i.e. at the temperature of liquid nitrogen of approximately 80K, in order to remove outside turbulence of temperature. Hence, a main body of the sensing element is disposed to a container having special structure as capable of cooling the sensing element at cryogenic temperatures and having an infrared radiation-transmitting window mounted thereto.

FIG. 3 shows the structure of an infrared radiation detector of a type as disclosed, for example, in Japanese Patent Laid-open Publication (kokai) No. 2-214,158. The infrared radiation detector contains a cryogenic container comprising an outer cylinder 3 with a window member 2 joined air-tight thereto, through which entering infrared radiation 1 passes, and an inner cylinder 4 connected integrally to the outer cylinder 3 and having a space 13 with the inside sealed and held at vacuo. To a top end portion 4a of the inner cylinder 4 of the cryogenic container is mounted the sensing element 10 for detecting infrared radiation generated from a semi-conductor through a sub-package 11 consisting of a frame-shaped package and a package bottom plate. At a top portion of the sub-package 11 is mounted a peripheral wall 12 for blocking stray light of entering infrared radiation 1, as called a cold shield, and an electric signal from the sensing element 10 is generally fetched into the outside of the cryogenic container with the aid of a terminal 5 of a glass hermetic seal 6 disposed at an outer cylindrical portion through an inner wire 8 along a side wall of the inner cylinder 4 via a terminal of the sub-package 11.

Description will now be made of the operations of the infrared radiation detector with reference to FIG. 3. As shown in FIG. 3, the infrared radiation 1 entering the cryogenic container through the infrared radiation-transmitting window 2 forms an image on a rear surface of the sensing element 10, and an electric charge carrier is produced in accordance with the magnitude of infrared rays. The electric charge is read by an electric charge transmitting section (not shown) integrated in the identical element and displayed as image data on an external signal processing circuit (not shown) through a non-illustrated package leads and inner cryogenic container leads 8 and an external terminal 5. During the operations of the detector, a cooling device, such as of a Joule-Thomson type or of a closed cycle type or the like, is inserted into a space 14 of the cryogenic container, and the sensing element 10 is cooled to the 80K level through the top end portion 4a of the inner cylinder 4 of the cryogenic container.

From the structure and operations of the infrared radiation detector as described hereinabove, the image signal of the sensing element for detecting infrared rays is processed as image data by the signal processing circuit disposed outside the cryogenic container. In this case, it is desired that the length of the lead within the cryogenic container be shortened to the shortest possible level in order to prevent deterioration of wave forms of signals detected. If the number of matrix pixels of the sensing element is increased in order to improve the dissolution of image data, it is necessary to increase the number of leads for fetching signals and to increase the density of the leads disposed on the wall surface of the inner cylinder and the number of external terminals of the hermetic seal of the outer cylinder of the cryogenic container.

In the structure of the conventional cryogenic container as shown in FIG. 3, the length of the lead is forced to be prolonged because the inner lead 8 is connected through the wall surface of the inner cylinder 4 to the terminal 5 disposed underneath the outer cylinder 3. The inner diameters of the inner cylinder 4 and the outer cylinder 3 of the cryogenic container are delimited by an interface with other parts relating to the infrared radiation detector, so that limitations are placed upon making the inner leads highly dense and increasing the number of the external terminals.

In summary, the conventional infrared radiation detector presents the drawbacks that there are limitations on prolonging the length of the internal leads of the cryogenic container, making the internal leads highly dense, and increasing the number of external terminals.

SUMMARY OF THE INVENTION

The present invention has been performed with the object to solve the problems inherent in the conventional infrared radiation detectors and to improve the deterioration of image signals resulting from the length of the leads and the limitations upon making the sensing elements highly dense and increasing the number of the terminals. Further, the present invention enables the ready preparation of the cryogenic container and permits the easy mounting of the infrared radiation sensing element to the cryogenic container, thereby reducing costs of the infrared radiation detector.

In order to achieve the object of the present invention, the infrared radiation detector having a cryogenic container with an infrared radiation detecting unit cooled at cryogenic temperature with a cooling device, characterized by a cryogenic container composed of an inner cylinder and an outer cylinder and having an inside thereof held at vacuum pressure; an infrared radiation detecting unit accommodated within the cryogenic container and disposed at a predetermined position of the inner cylinder; and a signal output section having a plurality of output terminals for fetching output of the infrared radiation detecting unit into the outside of the cryogenic container disposed at the outer cylinder of the cryogenic container in the vicinity of the infrared radiation detecting unit.

The infrared radiation detector according to the present invention has a signal output section having a plurality of output terminals for fetching output of the infrared radiation detector, the output section being disposed at the outer cylinder of the cryogenic container in the vicinity of the infrared radiation detecting unit.

In accordance with the present invention, the signals are fetched outside the cryogenic container via the signal output section having the plural output terminals disposed in the vicinity of the infrared radiation detecting unit, so that the length of the leads disposed within the cryogenic container can be shortened, thereby permitting the deterioration of the signals from the sensing element to be suppressed to the minimum level. Further, the present invention makes the leads highly dense so as to correspond to the increase in the number of signal lines from the infrared radiation detecting unit.

Other objects, features and advantages of the present invention will become apparent in the course of the description of the preferred embodiments, which follows, with reference to the accompanying drawings.

DETAILED DESCRIPTION OF THE PREFERRED EMBODIMENTS

The present invention will be described hereinafter by way of examples with reference to the accompanying drawings.

Figure 1:
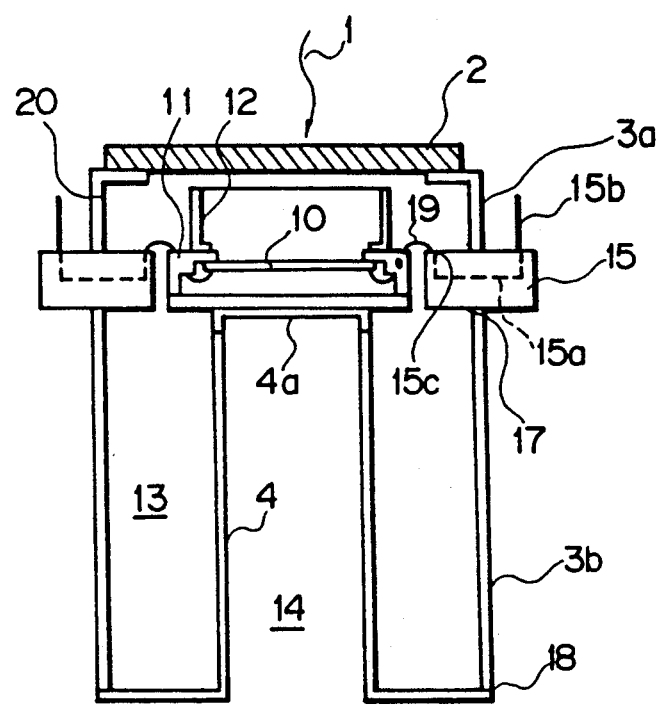
FIG. 1 is a schematic representation in section, showing an outline of the infrared radiation detector for detecting infrared radiation according to an embodiment of the present invention.
Figure 3:
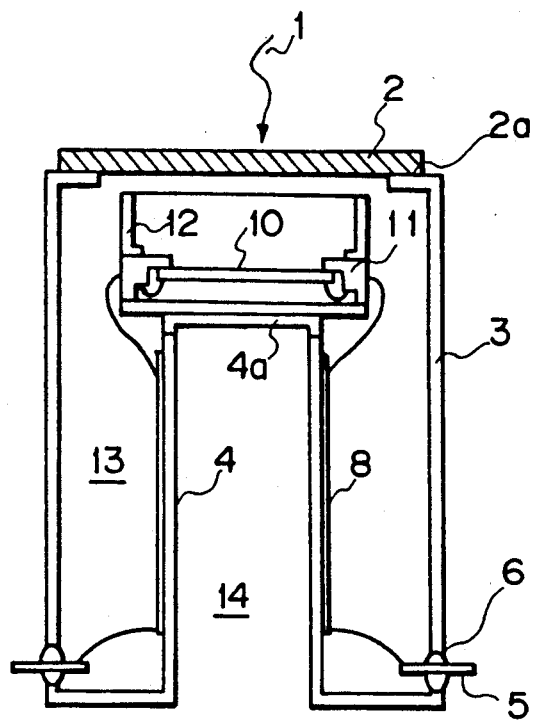
FIG. 3 is a schematic representation in section, showing a conventional infrared radiation detector.

FIG. 1 shows the infrared radiation detector according to an embodiment of the present invention. In FIG. 1, the same elements are provided with the same reference symbols as in FIG. 3 showing an outline of the conventional infrared radiation detector, and further description will be omitted from the following explanation.

As shown in FIG. 1, a cryogenic container of the infrared radiation detector comprises an outer cylinder 3 and an inner cylinder 4 made of a metal having a low thermal conductivity, such as titanium. On a top end portion 4a of the inner cylinder 4 is mounted an infrared radiation sensing element 10 accommodated in a sub-package 11. The top end portion 4a thereof is preferably made out of a material having a high thermal conductivity. The outer cylinder 3 is divided in the vicinity of the sub-package 11 into an upper section 3a and a lower section 3b. Between the upper and lower sections 3a and 3b is interposed a disk-shaped, multi-layered ceramic lead plate 15 which in turn is disposed on the same plane with the sub-package 11. The multi-layered ceramic lead plate 15 is composed of a plurality of internally embedded lead layers. The infrared radiation image signals are fetched from the infrared radiation element 10 to the outside of the cryogenic container in the shortest possible distance via the sub-package 11 connected through a wire bonding 19 to a bonding pad 15c of the multi-layered ceramic lead plate 15, an internal lead 15a thereof and a soldered plug-in terminal 15b thereof for fetching signals.

Figure 2A:
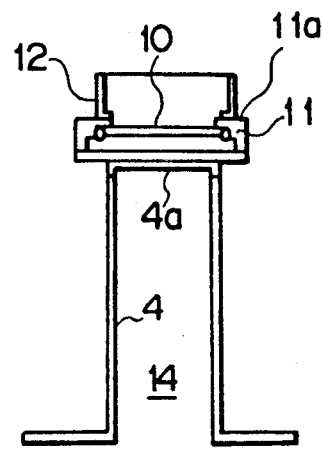
FIGS. 2(a), 2(b), 2(c) and 2(d) are schematic representations in section, each showing a portion of the infrared radiation detector according to an embodiment of the present invention.
Figure 2B:
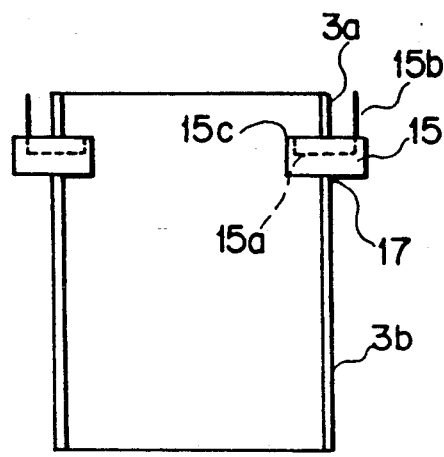

Detailed description will be made of the structure of the cryogenic container and the infrared radiation sensing element mounted thereto, with reference to FIGS. 2(a) to 2(d) which show the partial structures of the cryogenic container of the infrared radiation detector according to the present invention. As shown in FIG. 2(a), the sub-package 11 having the infrared radiation sensing element 10 and the cold shield 12 for blocking stray light of infrared radiation is mounted through an adhesive on the top end portion 4a of the inner cylinder 4 of the cryogenic container, thereby forming an inner cylinder assembly. The sub-package 11 has the infrared radiation sensing element 10 and a cold shield 12 for shielding stray light disposed thereon, and the inner cylinder 4 contains the space 14 into which an external cooling device is inserted. As shown in FIG. 2(b), the multi-layered ceramic lead plate 15 consisting of a plurality of wire bonding pads 15c, internally embedded lead layers 15a and plug-in terminals 15b is interposed between the upper and lower sections 3a and 3b into which the outer cylinder 3 is divided. The multi-layered ceramic lead plate 15 is secured with the aid of a soldering member 17 to both of the upper and lower sections 3a and 3b of the outer cylinder 3 through metallizing portions (not shown) disposed on the both sides of the ceramic lead plate 15, thereby forming an outer cylinder assembly.

In the structure of the outer cylinder assembly, the upper and lower sections 3a and 3b are made of Co-Fe-Ni alloy, such as Kovar, with the compatibility with thermal expansion of the multi-layered ceramic lead plate 15 taken into account. On the other hand, the ceramic lead plate 15 is composed of alumina porcelain, metallizable with a heat-resistant metal, such as tungsten, for the internal lead 15a and the bonding pad 15c. The Co-Fe-Ni alloy is employed for plug-in terminal 15b, like the upper and lower sections 3a and 3b of the outer cylinder 3. Further, as the soldering member 17 for joining the upper section 3a of the outer cylinder 3 and the lower section 3b thereof, Ag-Cu eutectic soldering material is effective because it is highly vacuum-tight reliable.

Figure 2C:
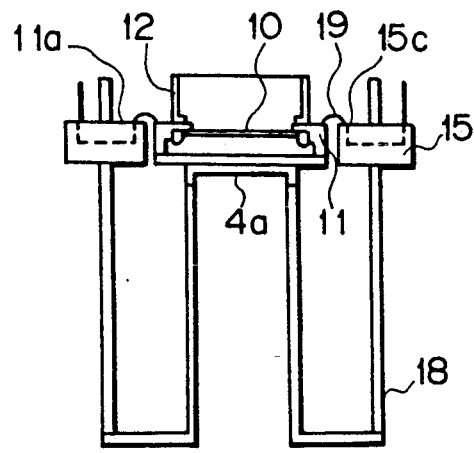

As shown in FIG. 2(c), the inner cylinder assembly as shown in FIG. 2(a) is bonded to the outer cylinder assembly as shown in FIG. 2(b) with the aid of a bonding section, as indicated by 18 in FIG. 2(c). Further, the bonding pad 11a of the sub-package 11 is bonded to the bonding pad 15c of the ceramic lead plate 15 with the aid of a wire bonding 19.

Figure 2D:
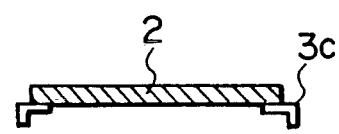

Referring to FIG. 2(d), a top end portion 3c of the outer cylinder 3, made of a metal, is air-tightly bonded to the radiation-transmitting window 2. The resulting assembly of FIG. 2(d) is then welded to the assembly of FIG. 2(c) at a welding portion 20 as shown in FIG. 1, and the pressure within the cryogenic container is reduced to vacuum to thereby form the vacuum space 13.

For the infrared radiation detector according to the embodiment of the present invention, the multi-layered ceramic lead plate 15 consisting of the plurality of the bonding pads 15c for wire bonding, the internally embedded lead layers 15a and the plug-in terminals 15b for fetching signals is disposed on the outer cylinder 3 of the cryogenic container so as to lie in the same plane as the sub-package 11 on which the infrared radiation sensing element 10 is mounted. Further, the bonding pad 11a of the sub-package 11 is bonded to the bonding pad 15c of the ceramic lead plate 15 with the aid of the wire bonding 19, so that the lead length within the cryogenic container can be made to the shortest possible level, thereby minimizing deterioration of the signals from the sensing element 10.

The multi-layered ceramic lead plate 15 is provided with the plural plug-in terminals 15b for fetching signals, so that they can deal with the increasing number of matrix pixels of the sensing element 10 and that sensing elements having high resolution can be mounted, which will be developed within short.

The connecting portion interposed between the bonding pad 11a of the sub-package 11 and the bonding pad 15a of the ceramic lead plate 15 is on the flat plane and is very short, so that the bonding pad 11a of the sub-package 11 is bonded to the bonding pad 15a of the ceramic lead plate 15 with the aid of wire bonding technique adopted in a conventional step for preparing semiconductors, thereby reducing wiring costs and leading to the automation of the manufacturing steps.

The infrared radiation detector according to the present invention is arranged so as to fetch signals into the outside of the cryogenic container via the signal output section having a plurality of the output terminals disposed in the vicinity of the infrared radiation detecting unit, thereby shortening the length of the lead disposed within the cryogenic container and suppressing the signals from the sensing element from deteriorating to the minimum level. Further, the present invention has the advantages that the wiring can be disposed in high density so as to correspond to the increase in the signal lines from the infrared radiation detecting unit, that the wire bonding technique employed conventionally for the steps for manufacturing semiconductors can be employed for bonding the leads within the cryogenic container, and that a reduction in the costs of wiring as well as automation of the manufacturing steps can be achieved.

What is claimed is:

1. An infrared radiation detector having a cryogenic container with an infrared radiation detecting unit cooled at cryogenic temperature with a cooling device, comprising:
    a cryogenic container composed of an inner cylinder and an outer cylinder and having an inside thereof held at vacuum pressure;
    an infrared radiation detecting unit accommodated within the cryogenic container and disposed at a predetermined position of the inner cylinder; and
    a signal output section disposed substantially in the same plane as that of the infrared radiation detecting unit for transferring output of the infrared radiation detecting unit outside of the cryogenic container, the signal output section comprising a multi-layered ceramic lead plate and a plurality of output terminals located outside the cryogenic container on the lead plate and electrically connected to the infrared radiation detecting unit.

2. An infrared radiation detector as claimed in claim 1, wherein the infrared radiation detecting unit is electrically bonded to the output terminals of the signal output section through a wire bonding.

3. An infrared radiation detector as claimed in claim 1, wherein the outer cylinder of the cryogenic container is bonded to the multi-layered ceramic lead plate through a metallized layer formed peripherally around the multi-layered ceramic lead plate with the aid of a soldering member so as to form a vacuum tight structure.

4. An infrared radiation detector as claimed in claim 1, wherein the multi-layered ceramic lead plate comprises a plurality of bonding pads for wire bonding, internally embedded internal lead layers and plug-in terminals.

5. An infrared radiation detector as claimed in claim 1, wherein the outer cylinder is divided into two sections.

6. An infrared radiation detector as claimed in claim 1, further comprising a cold shield mounted on the top end portion of the inner cylinder for blocking stray light of infrared radiation.

7. An infrared radiation detector as claimed in claim 6, wherein the cold shield comprises a cylindrical assembly coaxial with the inner cylinder.

8. An infrared radiation detector having a cryogenic container with an infrared radiation detecting unit cooled at cryogenic temperature with a cooling device, comprising:
    a cryogenic container composed of an inner cylinder and an outer cylinder and having an inside thereof held at vacuum pressure;
    an infrared radiation detecting unit accommodated within the cryogenic container and disposed on a top end portion of the inner cylinder;
    a signal output section comprising an electrically insulative lead plate and output terminals located on the lead plate; and
    means for electrically coupling the infrared radiation detecting unit to the output terminals, wherein the length of an electrical path from the infrared radiation detecting unit to the output terminals is approximately the distance from the infrared radiation detecting unit to the output terminals.

9. An infrared radiation detector having a cryogenic container with an infrared radiation detecting unit cooled at cryogenic temperature with a cooling device, comprising:
    a cryogenic container composed of an inner cylinder and an outer cylinder and having an inside thereof held at vacuum pressure;
    an infrared radiation detecting unit;
    a sub-package mounted on a top end portion of the inner cylinder and having means for mounting the infrared radiation detecting unit to the sub-package along the peripheral edge of the infrared radiation detecting unit;
    a signal output section comprising an electrically insulative lead plate and output terminals located on the lead plate; and
    means for electrically coupling the infrared radiation detecting unit to the output terminals.

10. An infrared radiation detector having a cryogenic container with an infrared radiation detecting unit cooled at cryogenic temperature with a cooling device, comprising:
    a cryogenic container composed of an inner cylinder and an outer cylinder and having an inside thereof held at vacuum pressure;
    an infrared radiation detecting unit accommodated within the cryogenic container and disposed on a top end portion of the inner cylinder; and
    a signal output section disposed substantially in the same plane as that of the infrared radiation detecting unit, comprising
        an electrically insulative lead plate extending radially in a direction from inside the cryogenic container to outside the cryogenic container;
        a plurality of output terminals located outside the cryogenic container on the lead plate;
        a plurality of conductive bonds extending from the infrared radiation detecting unit to the lead plate; and
        a plurality of conductive leads extending radially within the lead plate, each of the conductive leads electrically coupled to one of the plurality of conductive bonds and to one of the plurality of output terminals.

11. An infrared radiation detector as claimed in claim 10, wherein the length of each of the plurality of conductive leads is approximately the radial distance from the conductive bond to which the conductive lead is coupled to the output terminal to which the conductive lead is coupled.

12. An infrared radiation detector as claimed in claim 11, wherein the lead plate does not extend inward to the inner cylinder or the infrared radiation detecting unit.

13. An infrared radiation detector having a cryogenic container with an infrared radiation detecting unit cooled at cryogenic temperature with a cooling device, comprising:

a cryogenic container composed of an inner cylinder and an outer cylinder and having an inside thereof held at vacuum pressure;
 an infrared radiation detecting unit;
 a sub-package mounted on a top end portion of the inner cylinder and having means for mounting the infrared radiation detecting unit to the sub-package along the peripheral edge of the infrared radiation detecting unit;
 a cold shield for blocking stray light of infrared radiation mounted on the top of the sub-package;
 a signal output section disposed substantially in the same plane as that of the sub-package comprising
  an electrically insulative lead plate extending radially from a position beyond the inner cylinder but within the outer cylinder to a position outside the cryogenic container;
  a plurality of output terminals located outside the cryogenic container on the lead plate;
  a plurality of conductive bonds extending from the infrared radiation detecting unit to the lead plate; and
  a plurality of conductive leads extending radially within the lead plate, each of the conductive leads electrically coupled to one of the plurality of conductive bonds and to one of the plurality of output terminals.

14. An infrared radiation detector as claimed in claim 13, wherein the length of each of the plurality of conductive leads is approximately the radial distance from the conductive bond to which the conductive lead is coupled to the output terminal to which the conductive lead is coupled.

* * * * *